US010522718B2

(12) United States Patent
Tångring

(10) Patent No.: US 10,522,718 B2
(45) Date of Patent: Dec. 31, 2019

(54) LIGHT-EMITTING SEMICONDUCTOR CHIP AND OPTOELECTRONIC COMPONENT

(71) Applicant: OSRAM Opto Semiconductors GmbH, Regensburg (DE)

(72) Inventor: Ivar Tångring, Regensburg (DE)

(73) Assignee: OSRAM OPTO SEMICONDCUTORS GMBH, Regensburg (DE)

(*) Notice: Subject to any disclaimer, the term of this patent is extended or adjusted under 35 U.S.C. 154(b) by 0 days.

(21) Appl. No.: 16/052,554

(22) Filed: Aug. 1, 2018

(65) Prior Publication Data
US 2019/0044032 A1 Feb. 7, 2019

(30) Foreign Application Priority Data

Aug. 2, 2017 (DE) .......................... 10 2017 117 504

(51) Int. Cl.
*H01L 33/48* (2010.01)
*H01L 33/56* (2010.01)
*H01L 33/50* (2010.01)
*H01L 33/60* (2010.01)

(52) U.S. Cl.
CPC ............ *H01L 33/483* (2013.01); *H01L 33/50* (2013.01); *H01L 33/56* (2013.01); *H01L 33/60* (2013.01)

(58) Field of Classification Search
None
See application file for complete search history.

(56) References Cited

U.S. PATENT DOCUMENTS

| 8,089,087 | B2 | 1/2012 | Lee | |
|---|---|---|---|---|
| 9,681,502 | B2 | 6/2017 | Oyamada et al. | |
| 2015/0014720 | A1 | 1/2015 | Tien | |
| 2015/0049481 | A1 | 2/2015 | Oyamada et al. | |
| 2017/0155018 | A1* | 6/2017 | Kuo | ............... H01L 33/32 |
| 2017/0365736 | A1* | 12/2017 | Barchmann | ............ H01L 21/78 |

FOREIGN PATENT DOCUMENTS

| DE | 102014108300 A1 | 12/2015 |
|---|---|---|
| EP | 2881999 A1 | 6/2015 |
| EP | 3392919 A1 | 10/2018 |
| JP | 2001-223391 A | 8/2001 |
| JP | 2008-300460 A | 12/2008 |
| JP | 2011-249476 A | 12/2011 |
| JP | 2015-037170 A | 2/2015 |
| JP | 2015-133477 A | 7/2015 |
| JP | 2015-216139 A | 12/2015 |
| KR | 10-2014-0108973 A | 9/2014 |

OTHER PUBLICATIONS

Examination Report received in Japanese Patent Application No. 2018-145194, dated Jul. 22, 2019.

* cited by examiner

Primary Examiner — Dung A. Le
(74) Attorney, Agent, or Firm — McDermott Will & Emery LLP

(57) ABSTRACT

A light-emitting semiconductor chip comprises: a radiation-transmissive substrate, an epitaxially grown semiconductor layer sequence on a main surface of the substrate, a first contact and a second contact on a contact surface of the semiconductor layer sequence facing away from the substrate for electrical and mechanical contacting of the semiconductor chip, a transparent, electrically conductive layer which is arranged on the contact side and is electrically connected to the first contact.

15 Claims, 3 Drawing Sheets

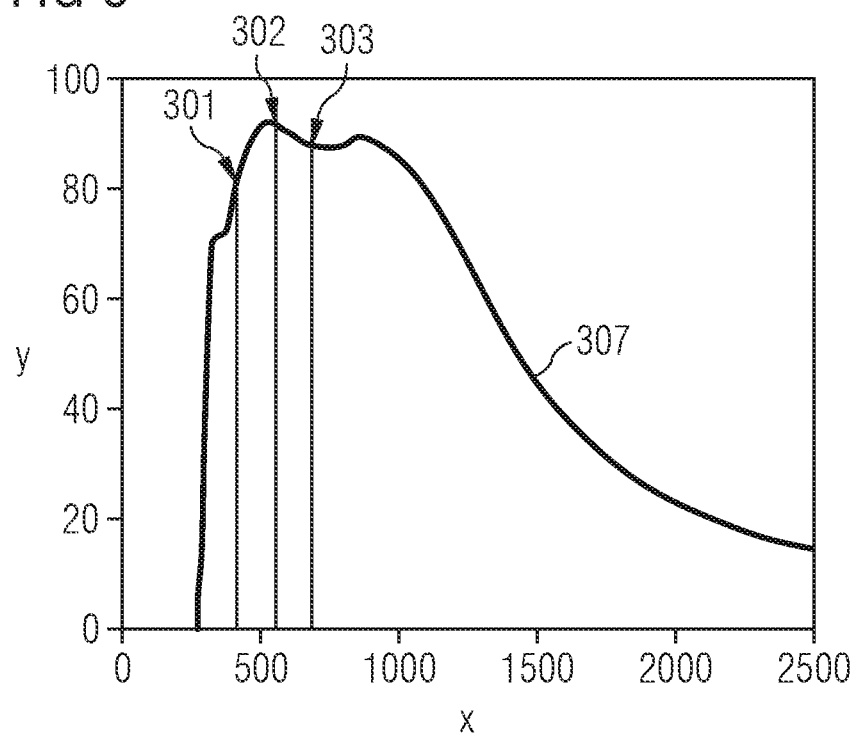

LIGHT-EMITTING SEMICONDUCTOR CHIP AND OPTOELECTRONIC COMPONENT

Figure 1:
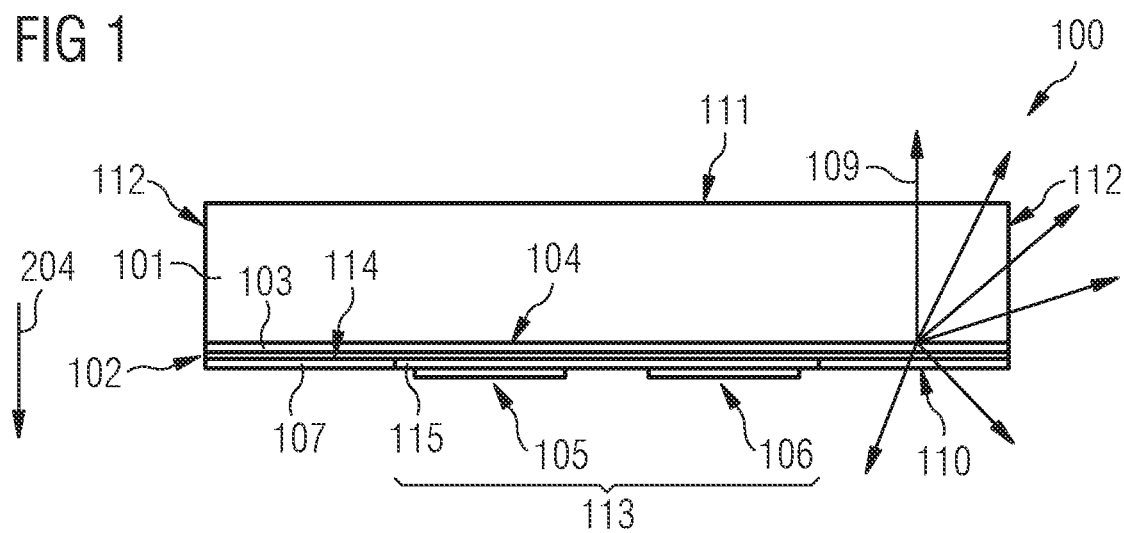

This patent application claims the priority of the German Patent Application 10 2017 117 504.0, the disclosure of which is hereby incorporated by reference.

The application relates to a light-emitting semiconductor chip and an optoelectronic component with such a semiconductor chip.

It is desirable to provide a semiconductor chip and an optoelectronic device that enables efficient operation.

According to an embodiment, a light-emitting semiconductor chip has a radiation-transmissive substrate. The substrate is, for example, a sapphire substrate. According to further embodiments, the substrate is made of a different material. The substrate is, for example, a growth substrate. The substrate is a carrier substrate according to further embodiments. The radiation-transmissive substrate is formed in particular from a material and with a layer thickness such that the substrate has a transmittance of at least 60%, 70%, 80% or at least 90% with respect to a wavelength of an electromagnetic radiation generated during operation of the semiconductor chip. In particular, light in the visible range, as well as in the adjacent ultraviolet and infrared range, is absorbed as little as possible by the substrate. In particular, the substrate has a transmittance of at least 60%, 70% or 80% or at least 90% for these wavelength ranges.

According to an embodiment, the light-emitting semiconductor chip has an epitaxially grown semiconductor layer sequence on a main surface of the substrate. The semiconductor layer sequence has, for example, a p-type semiconductor layer and an n-type semiconductor layer. In a vertical direction, also called growth direction, an active layer is arranged between the p-type semiconductor layer and the n-type semiconductor layer, for example. The active layer is, for example, a pn-junction.

For example, the semiconductor layer sequence is based on gallium nitride, indium gallium nitride, or another material such as gallium arsenide. During operation of the semiconductor chip, the semiconductor layer sequence is in particular configured to emit the electromagnetic radiation in the visible, ultraviolet or infrared spectral range. For example, the semiconductor chip is a light emitting diode (LED).

According to an embodiment, the semiconductor layer sequence is grown on the substrate. The substrate is thus the growth substrate of the semiconductor layer sequence. According to a further embodiment, the semiconductor layer sequence is first grown on another substrate and subsequently applied to the substrate. The substrate then not the growth substrate, but the carrier substrate.

According to an embodiment, the light-emitting semiconductor chip has a first contact and a second contact on a contact side of the semiconductor layer sequence facing away from the substrate for the electrical and mechanical contacting of the semiconductor chip. The first contact is, for example, electrically conductively connected to the n-conducting layer of the semiconductor layer sequence. The second contact is, for example, electrically conductively connected to the p-type layer of the semiconductor layer sequence. The first and the second contact serve to provide a connection an external current/voltage source to the light-emitting semiconductor chip during operation. For example, the first and the second contact are adapted to be electrically conductively connected to conductors of a carrier, also called a leadframe. The first and/or the second contact comprise, according to an embodiment, a plurality of layers of a dielectric material and an electrically conductive metal, such as silver. In particular, the first and/or the second contact are each designed to be reflective at least on a side facing the substrate, in particular for the radiation emitted by the semiconductor layer sequence.

According to an embodiment, the light-emitting semiconductor chip has a transparent, electrically conductive layer. The transparent, electrically conductive layer is arranged in particular on the contact side. The transparent, electrically conductive layer is electrically connected to the first contact.

The transparent, electrically conductive layer is, for example, a transparent, electrically conductive oxide (also called TCO). For example, the layer is of indium tin oxide. The electrically conductive layer serves, for example, for connecting the first contact to the semiconductor layer sequence. By means of the electrically conductive layer, moreover, the semiconductor layer sequence is supplied with current or voltage on a surface which is larger than the surface of the contacts.

The transparent, electrically conductive layer is in particular transparent to electromagnetic radiation in the visible, infrared and/or ultraviolet range. With regard to a peak wavelength of the electromagnetic radiation generated during operation of the semiconductor layer sequence, the electrically conductive layer has a transmittance of at least 60%, 70%, 80% or at least 90%.

The transparent electrically conductive layer may also be referred to as a current spreading layer.

According to an embodiment, a light-emitting semiconductor chip has a radiation-transmissive substrate. The semiconductor chip has an epitaxially grown semiconductor layer sequence on a main surface of the substrate. The semiconductor chip has a first contact and a second contact on a contact side of the semiconductor layer sequence facing away from the substrate. The first contact and the second contact each are used for electrical and mechanical contacting of the semiconductor chip. The semiconductor chip has a transparent, electrically conductive layer. The transparent electrically conductive layer is disposed on the contact side and electrically connected to the first contact.

According to an embodiment, the semiconductor chip is designed as a volume emitter. Electromagnetic radiation generated during operation of the semiconductor chip can be decoupled via a front side, a back side and via side surfaces of the semiconductor chip. The rear side is, for example, a side of the substrate facing away from the semiconductor layer sequence. The side surfaces of the semiconductor chip may be formed, for example, by side surfaces of the substrate.

The radiation generated during operation in the semiconductor layer sequence can be coupled out through the transparent, electrically conductive layer on the back side of the semiconductor chip. The radiation can be coupled out through the radiation-transmissive substrate on the front side and the side surfaces of the semiconductor chip.

According to an embodiment, the first contact and the second contact are arranged on the contact side between the electrically conductive layer. The electrically conductive layer is disposed closer to a respective side surface than the first and second contacts. The first contact and the second contact are arranged, for example, in a central region of the contact side. The transparent, electrically conductive layer extends in particular from the contacts to the side surface of the semiconductor chip. For example, an area ratio between 30% and 90% of the contact side is covered by the transparent, electrically conductive layer. In particular, the area ratio of the contacts is chosen to be as small as possible in comparison to the area ratio of the transparent, electrically conductive layer. However, the first and the second contact are at least chosen so large that a sufficient mechanical and/or electrical contact is possible. In particular, this is limited by tolerances during production. For example, the area ratio of the transparent, electrically conductive layer is between 30% and 50% of the contact side.

According to an embodiment, an optoelectronic component has a semiconductor chip according to at least one embodiment.

The optoelectronic component has, according to an embodiment, a carrier with a first and a second electrical conductor. The carrier is also referred to as a leadframe. The carrier is adapted to mechanically support the semiconductor chip. The carrier further provides an interface for electrically contacting the semiconductor chip. For example, the first and the second electrical conductor can be coupled to an external current/voltage source.

According to an embodiment, the first contact is electrically and mechanically coupled to the first conductor. The second contact is electrically and mechanically coupled to the second conductor. The semiconductor chip is thus held and supported mechanically by the carrier, in particular by means of the two contacts. In addition, the semiconductor chip is electrically contacted by means of the conductors and thus can be supplied with current/voltage.

According to an embodiment, the transparent, electrically conductive layer is at a distance from the carrier along a stacking direction of the semiconductor layer sequence. The stacking direction is aligned in particular along the vertical and can also be referred to as a growth direction. The transparent electrically conductive layer is not in contact with the carrier, in particular not in contact with the conductors of the carrier.

According to an embodiment, an optoelectronic component has a semiconductor chip according to at least one embodiment of this application. The optoelectronic component has a carrier with a first and a second electrical conductor. The first contact is electrically and mechanically coupled to the first conductor. The second contact is electrically and mechanically coupled to the second conductor. The transparent, electrically conductive layer has a spacing from the carrier along a stacking direction of the semiconductor layer sequence.

A semiconductor chip described and an optoelectronic component described are based, inter alia, on the following considerations. The metallic contacts of the semiconductor chip, which are formed for example of silver, and typical conductors of an optoelectronic component have a comparatively poor degree of reflection, in particular for radiation in the blue region. The low reflectance leads to optical losses and thus reduces the efficiency of the component.

The semiconductor chip described and the optoelectronic component described make use, among other things, of the idea that the metallic contacts are made smaller and are arranged in particular in the central region of the semiconductor chip instead of on whole surface of the semiconductor chip. The semiconductor chip is thus fastened on the conductors, for example by means of soldering, in such a way that the distance between the semiconductor chip and the conductors is formed, in particular outside the contacts of the semiconductor chip. A portion of the semiconductor chip thus remains free and radiation can decouple from the semiconductor chip at these points instead of being reflected by the full-surface metallization. Thus, losses can be avoided, which occur when the radiation is reflected directly on the chip. This radiation can be absorbed again in the semiconductor chip before leaving the semiconductor chip.

According to an embodiment, a converter for wavelength conversion is arranged between the transparent, electrically conductive layer and the carrier. For example, the semiconductor chip is designed to emit radiation in the blue wavelength range. The converter converts the radiation in the blue region to radiation in another wavelength range, for example in the green and/or red wavelength range. The converter comprises, for example, phosphorus. Due to the converter, which is arranged between the transparent, electrically conductive layer and the conductors, the radiation of the semiconductor chip is in particular converted before it hits the conductors. Thus, as little as possible radiation in the blue region hits the conductor but rather radiation in the green and/or red wavelength range. The radiation which hits the printed conductors is reflected by the printed conductors. The reflection properties of the printed conductors are better in the red and/or green wavelength range than in the blue wavelength range. In the green and/or red wavelength range, less radiation is absorbed by the conductors than in the blue wavelength range. Thus, during operation, more radiation is reflected from the conductors and less absorbed. Thus, the efficiency of the component is increased.

All in all, a smaller proportion of blue radiation must be reflected by the conductors and in the semiconductor chip. A greater portion of the radiation is converted before the radiation hits a reflective surface. The converted radiation has less reflection losses on the metallic conductors and contacts, which are made of silver, for example.

According to an embodiment, a further converter for wavelength conversion is arranged on one side of the substrate facing away from the contact side. For example, the converter and the further converter have mutually different concentrations of converter material. In particular, the concentration of the converter material in the converter between the transparent, electrically conductive layer and the conductors is higher than the concentration in the further converter. Radiation emitted towards the conductors is thus more likely to be converted. Thus, once again less radiation has to be reflected in the blue area. Radiation that is not emitted in the direction of the conductors, but, for example, in an opposite direction, is converted by the other converter, so that a little more blue radiation can be emitted unreflected. Consequently, in the other converter less conversion must take place, whereby the further converter is less heated.

For example, the converter and the other converter have the same materials but in different compositions. According to at least a further embodiment, the converter and the further converter have mutually different materials, for example different silicones and/or mutually different phosphors. Thus, it is possible to respond to the different conditions and in particular to realize different degrees of conversion.

According to an embodiment, the first and the second electrical conductors each have a recessed region in which the converter is arranged. Thus, it is comparatively easy to bring the converter between the transparent electrically conductive layer and the conductors.

According to an embodiment, the first and the second contact each have a projecting region, which is coupled to the respective conductor in order to form the distance to the carrier. For example, the projecting regions of the contacts are formed by electroplating. According to embodiments, the recessed region in the electrical conductors can then be dispensed with.

According to an embodiment, the first and the second conductors alternatively or additionally each have a projecting region, which is coupled to the respective contact in order to form the distance to the carrier. The two conductors have a kind of pedestal, so that the semiconductor chip in particular in the region of the transparent, electrically conductive layer has the distance to the conductors.

According to an embodiment, the semiconductor layer sequence, the first contact and the second contact are arranged between the substrate and the two electrical conductors along the stacking direction. The semiconductor layer sequence, the first contact and the second contact are thus facing the carrier. The substrate faces a main exit surface of the component.

The semiconductor chip and the component with the semiconductor chip thus have a higher efficiency, since a higher proportion of the radiation is converted before it is reflected. In addition, a higher proportion of converted radiation is reflected than radiation in the blue region. The converter between the semiconductor chip and the carrier can be cooled efficiently, in particular since the conductors are thermally conductive. Due to the smaller contact surface between the semiconductor chip and the conductors compared to conventional semiconductor chip mechanical stresses are reduced during operation. The mechanical stresses can also be reduced due to the projecting portions and/or the recessed portions.

Figure 2:
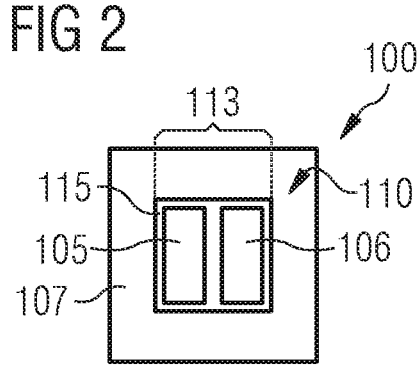
Figure 3:
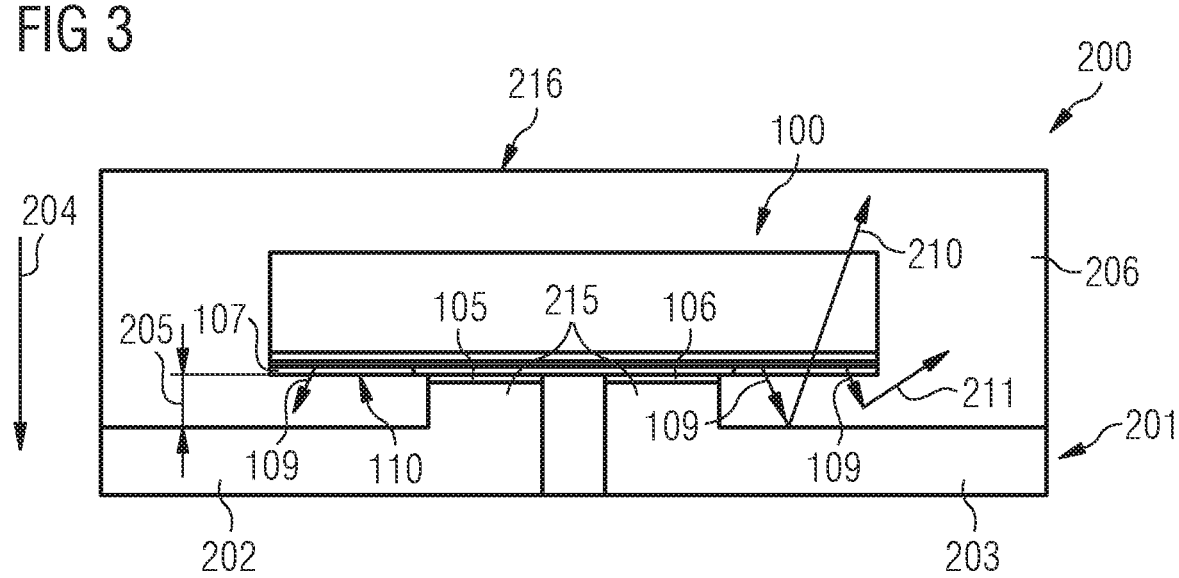
Figure 4:
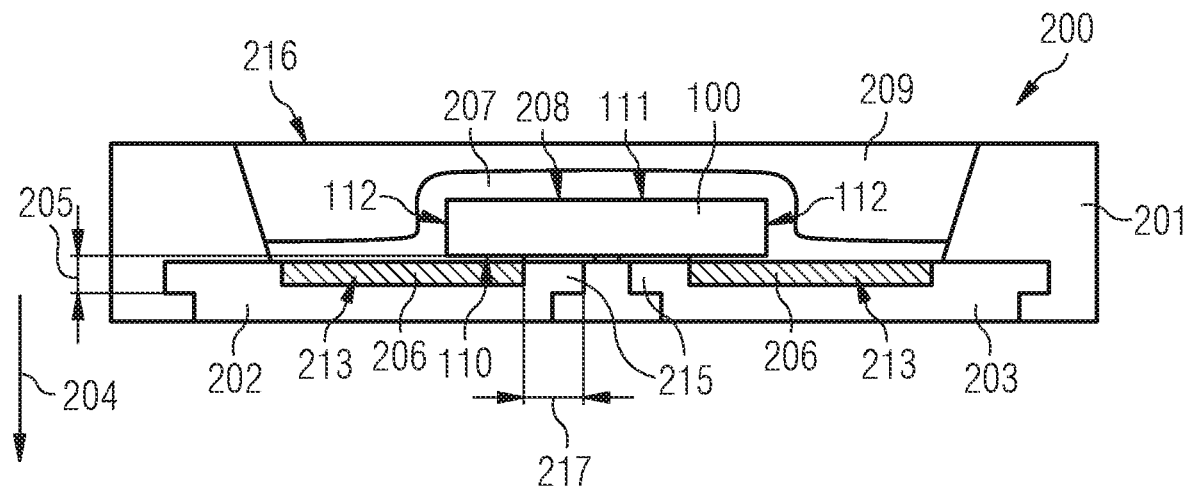
Figure 5:
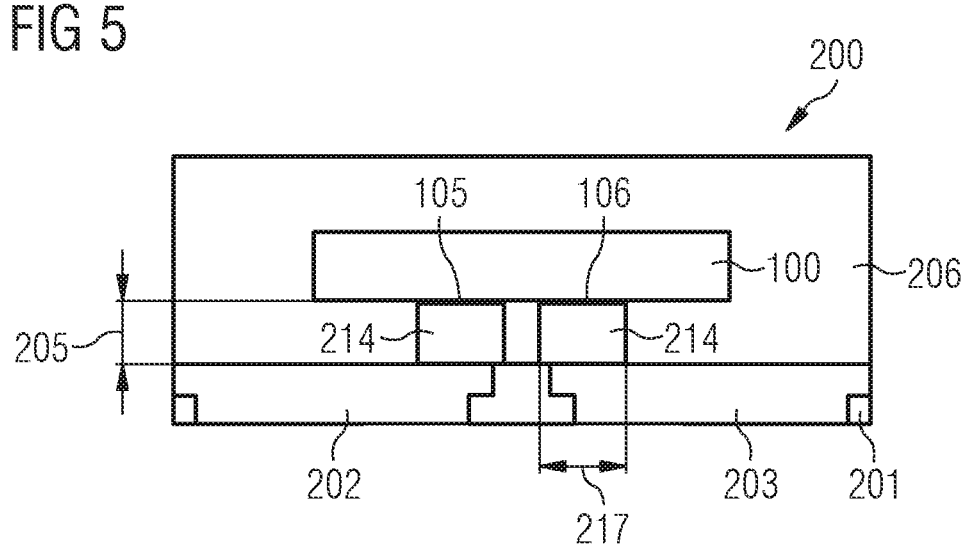

Exemplary embodiments of the invention are explained in more detail below with reference to the schematic drawings, in which:

FIG. 1 shows a schematic view of a light-emitting semiconductor chip according to an exemplary embodiment, FIG. 2 shows a schematic view of the front side of the semiconductor chip according to an exemplary embodiment, FIG. 3 shows a schematic view of an optoelectronic component according to an exemplary embodiment, FIG. 4 shows a schematic view of an optoelectronic component according to an exemplary embodiment, FIG. 5 shows a schematic view of an optoelectronic device according to an embodiment, and FIG. 6 shows a schematic view of the transmission properties of a transparent, electrically conductive layer according to an exemplary embodiment.

Elements of identical design or function may be identified by the same reference signs throughout the figures. The figures and the proportions of the elements shown in the figures are not to be considered to scale with each other.

FIG. 1 shows a schematic illustration of a light-emitting semiconductor chip 100 according to one exemplary embodiment. The light-emitting semiconductor chip 100 has a sheetlike extended substrate 101. The substrate 101 is, for example, a sapphire substrate. The substrate 101 is in particular radiation-transmissive to electromagnetic radiation 109 which is generated by the light-emitting semiconductor chip 100 during operation. The substrate 101 has a semiconductor layer sequence 102 on a main surface 104. The semiconductor layer sequence is in particular an epitaxially grown semiconductor layer sequence of indium gallium nitride. Other materials for the substrate 101 and the semiconductor layer sequence 102 are also possible.

The semiconductor layer sequence 102 has an active layer 103, for example a pn junction. The semiconductor layer sequence 102 is configured to emit the electromagnetic radiation 109, in particular in the blue spectral range.

On a side 114 of the semiconductor layer sequence 102 facing away from the substrate 101, a first contact 105 and a second contact 106 are formed. The first and the second contact 105, 106 are used in particular for the electrical and mechanical contacting of the semiconductor chip 100. By means of the first and the second contact 105, 106, it is possible to apply an electrical voltage to the semiconductor layer sequence 102, so that the radiation 109 is emitted. For example, the first contact 105 has a contact layer 115. The contact layer 115 has one or more dielectric layers and metal layers. In particular, the contact layer 115 has layers of silver. The contact layer 115 is formed in particular reflective.

The contacts 105, 106 are each arranged in a middle region 113 of the semiconductor chip 100. The contacts 105, 106 do not extend in the lateral direction along the contact side 114 all the way to side surfaces 112 of the semiconductor chip 100. The side surfaces 112 each extend in particular along a stacking direction 204, which runs in particular vertically. The side surfaces 112 extend along the stacking direction 204 between a rear side 111 of the semiconductor chip 100, which faces away from the semiconductor layer sequence 102. A front side 110 of the semiconductor chip lies opposite the rear side 111.

The contacts 105 and 106 do not completely cover the contact side 114. The contacts 105 and 106 only partially cover the semiconductor layer sequence 102, in particular the contact side 114. A region of the semiconductor layer sequence 102, in particular the contact side 114, is free of the reflective contacts 105, 106.

The areas of the contact side 114 that are not covered by the contacts 105, 106 are covered by a transparent, electrically conductive layer 107. The transparent electrically conductive layer 107 is electrically connected to the first contact 105. The second contact 106 is in particular electrically connected to an opposite side of the semiconductor layer sequence 102, for example by means of plated-through holes (not explicitly shown), also called vias. Correspondingly, the second contact 106 is electrically insulated from the first contact 105 and the electrically conductive layer 107. Electrical current, which flows to the contacts 105, 106 during operation, flows at least partially further into the layer 107 and from there to the semiconductor layer sequence 102. The layer 107 thus serves as a current spreading layer in order to contact the semiconductor layer sequence 102 as fully as possible electrically.

The transparent, electrically conductive layer 107 is transmissive in particular to the electromagnetic radiation 109 that is generated in the semiconductor layer sequence 102. For example, the layer 107 is formed of indium tin oxide.

The semiconductor chip 100 is thus designed as a volume emitter. The radiation 109 leaves the semiconductor chip 100 on the front side 110 through the layer 107, on the rear side 111 and on the side surfaces 112. Only in the middle region 113 of the front side 110, in which the metallic contacts 105, 106 are arranged, the radiation is not emitted.

FIG. 2 shows a plan view of the front side 110 of the semiconductor chip 100 according to one exemplary embodiment. The contacts 105, 106 are arranged in the central region 113. The contacts 105, 106 form only part of the front side 110. Outside the contacts 105, 106, the layer 107 is formed. The layer 107 surrounds the contacts 105, 106 on the front side 110. In particular, the contacts 105, 106 cover a range between 20% and 50% of the front side 110. The metallic contacts 105 and 106 are formed as small as possible, but still one sufficient thermal conductivity and mechanical handling remains. For example, the contacts 105, 106 are about 150 to 200 microns wide and 200 to 300 microns long in a 1×1 mm$^2$ large semiconductor chip 100.

FIG. 3 shows a schematic representation of an optoelectronic component 200 according to an exemplary embodiment. The component 200 has the light-emitting semiconductor chip 100 according to at least one embodiment.

The semiconductor chip 100 is electrically and mechanically connected to printed conductors 202, 203 of a carrier 201 by means of the contacts 105, 106, for example by means of soldering.

The carrier 201 serves both to support the semiconductor chip 100 and to provide an electrical interface for the electrical contacting of the semiconductor chip 100. The first electrical conductor 202 is in particular connected to the first contact 105. The second electrical conductor 203 is in particular connected to the second contact 106. The conductors 202, 203 are, for example, copper conductors, which are coated with silver. The conductors 202 and 203 are formed in particular reflective, as will be explained in more detail below.

In the exemplary embodiment shown, the printed conductors 202, 203 each have a projecting region 215. With regard to the lateral main propagation direction of the conductors 202, 203, the regions 215 respectively project vertically against the stacking direction 204. The electrical and mechanical contact with the contacts 105, 106 is formed on the projecting regions 215. Thus, the semiconductor chip is arranged outside the projecting regions 215 at a distance 205 from the printed conductors 202, 203. In particular, the outside of the layer 107 facing away from the semiconductor layer sequence is arranged at a distance from the printed conductors 202, 203. Thus, the radiation 109 may also exit at the front side 110 of the chip 100 before being reflected by the conductors 202, 203.

The component 200 has a main exit area 216 from which, in operation, the radiation is mainly intended to leave the component 200. The main exit area 216 faces away from the carrier 201 and the conductors 202, 203. Due to the distance 205 and the transparent layer 107, radiation 109 can initially leave the semiconductor chip 100 in the direction of the carrier 201 and is only subsequently reflected in the direction of the main exit area 216. Compared to semiconductor chips, in which the contact side 114 is completely metallized in order to reflect the radiation directly in the direction of the main exit surface, thus lower absorptions occur in the semiconductor chip 100 itself, since the radiation 109 can leave the semiconductor chip 100 on the front side 110 unreflected.

The component 200 has a converter 206 which surrounds the semiconductor chip 100. In particular, the converter 206 is also arranged on the transparent, electrically conductive layer 107. The converter 206 is arranged in particular along the stacking direction 204 between the semiconductor chip 100 and the conductors 202, 203. The converter 206 has in particular a converter material which converts the radiation 109 into radiation 210, 211 with a wavelength which is different from the radiation 109. For example, the converter comprises phosphorus which is in a silicone 209.

For example, the converted radiation 210 has a wavelength in the red region. The converted radiation 211 has, for example, a wavelength in the green range.

As shown by the example of the converted radiation 210, at least part of the radiation 109 is converted before it is reflected by the conductor 202 or the conductor 203 in the direction of the main exit surface 216. The example of the converted radiation 211 shows that part of the radiation 109 is already aligned by the conversion in the direction of the main exit surface 216.

Metals, for example silver, aluminum or gold, have wavelength-dependent reflection properties. In the blue region 301, the reflectivity is lower, in particular in the case of silver, than in the green region 302 and in the red region 303 (FIG. 6).

Due to the use of the transparent, electrically conductive layer 107 and the arrangement of the semiconductor chip 100 at a distance 205 from the reflective conductors 202, 203, a large proportion of blue radiation 109 leaves the semiconductor chip 100. There are fewer absorption losses in the semiconductor chip 100 itself, since the absorption in the chip for the radiation 210 and 211 in the green and red regions is less than for the radiation 109 in the blue region.

Overall, only a minor portion of the emitted radiation 109 must be reflected by a metallic surface or a metallic mirror. As shown by the example of the converted radiation 210 and 211, there is a high probability that the radiation 109 will be converted before it reaches a reflective surface. In addition, the reflective properties of the conductors 202, 203 are better for the converted radiation 210 and 211 than for the radiation 109. It is thus possible that radiation leaving the chip 100 at the front 110 need not be reflected at all, as shown in the example the radiation 211. Radiation exiting the chip 100 at the front side 110 is also highly likely to be converted before it is reflected on the conductors 202, 203, as shown by the example of the radiation 210.

Due to the distance 205 between the chip 100 and the conductors 202, 203, the converter 206 between the chip 100 and the carrier 201 is sufficiently cooled, in particular due to the thermal conductivity of the conductors 202, 203. This contributes to a long life of the device 200.

In addition, the projecting regions 215 reduce mechanical stresses within the component 200 and the semiconductor chip 100. The contact area between the conductors 202, 203 and the contacts 105 and 106 is reduced, in particular in comparison to conventional full-surface contacts 105, 106.

The component 200 thus enables a higher efficiency, since reflection losses or absorption at metallic reflectors (also called mirrors) are reduced.

FIG. 4 shows the optoelectronic component 200 according to a further exemplary embodiment. The component 200 essentially corresponds to the component 200, as explained in connection with FIG. 3. In contrast, in addition to the converter 206, a further converter 207 is provided. The further converter 207 is arranged, in particular, on a side 208 of the substrate 101 facing away from the printed conductors 202, 203. The further converter 207 covers, for example, the rear side 111 and the side surfaces 112 of the chip 100. The further converter 207 has, for example, a lower concentration of phosphorus than the converter 206. According to further embodiments, the converter 206 and the further converter 207 have mutually different materials, for example, different silicones 209 and/or different phosphors.

In the embodiment of FIG. 4 the converter 206 is arranged along the stacking direction 204 between the semiconductor chip 100 and the conductors 202, 203. The radiation 109, which leaves the semiconductor chip 100 in the direction of the conductors 202, 203, is thus converted with a higher probability. Radiation exiting the semiconductor chip 100 at the side surfaces 112 and the backside 111 is converted with less probability. Thus, the effect can be amplified that radiation which must be reflected by the conductors 202, 203 to the main exit surface 216, is preferably converted. The radiation exiting the chip on the front side 110 is therefore preferably converted rather than just reflected. For example, it is possible for the further converter 207 to convert, above all, into the green range. The converter 206 preferably converts to the red area. Thus, it is exploited that the reflective properties of the conductors 202, 203 in the red area 303 (FIG. 6) are even better than in the green area 302. In addition, since phosphor for conversion to the red region becomes hotter according to embodiments, the thermal advantage due to cooling by means of the conductors 202, 203 is exploited. In addition, radiation from converter 206 located below may be converted to the green region without absorption or with only slight absorption by the further converter 207. This reduces the likelihood that a phosphor that converts to the red region absorbs radiation in the green region.

For the arrangement of the converter 206, the conductors 202, 203 each have a recessed region 213. The recessed region 213 is reset in particular vertically. Thus, by means of the projecting region 215 and the recessed regions 213, it is possible to form the distance 205 so that the converter 206 can be disposed between the semiconductor chip 100 and the conductors 202, 203. The distance 205 is in particular between 50 and 100 µm. In particular, the size of the distance 205 depends on the particle size used. The distance 205 is at least so great that the particles of the converter 206, that is to say in particular the phosphor particles, can pass sufficiently well between the semiconductor chip 100 and the conductors 202, 203. For example, the converter 206 and the further converter 207 are formed as separate pottings. First, the potting for the converter 206 is applied so as to flow between the semiconductor chip 100 and the conductors 202, 203. Subsequently, the potting for the further converter 207 is applied.

The projecting regions 215 are, for example, each about 100 µm high, in particular in a range between 50 µm and 200 µm high, so that a corresponding distance 205 is formed. The protruding areas 215 each have, for example, a width 217 between 200 µm and 300 µm.

FIG. 5 shows the optoelectronic component 200 according to a further embodiment. The exemplary embodiment of FIG. 5 substantially corresponds to the exemplary embodiments of FIGS. 3 and 4. In contrast, the printed conductors 202, 203 have no projecting region 215 and no recessed region 213. Instead, the contacts 105 and 106 are each formed with a protruding region 214 to realize the distance 205 between the semiconductor chip 100 and the conductors 202, 203. The projecting regions 214 are, for example, electrodeposited on the contact layer 115 with a vertical height of 100 µm or more.

According to further embodiments, a combination of the projecting regions 214 of the contacts 105, 106 and the projecting regions 215 of the conductors 202, 203 is also possible.

FIG. 6 shows the radiation transmittance or transmission 307 of the transparent, electrically conductive layer 107 as a function of the wavelength on the example of indium tin oxide. In the blue region 301, less radiation is transmitted and more radiation is absorbed than in the green region 302 and in the red region 303. Consequently, the absorption losses for the radiation that has to pass again from the carrier 201 through the chip 100 to the main exit surface 216 are lower, as shown in FIG. 3 using the example of the converted radiation 210. Before the radiation transmits a second time through the transparent electrically conductive layer 107, it is converted to the green or red region in which the transmission is higher and the absorption is lower.

Overall, therefore, the need to reflect radiation 109 in the blue region is reduced. In particular, it is possible to deflect radiation in the direction of the main exit surface 216 without having to reflect it. Radiation that has to be reflected, in particular, is reflected only after the conversion. Since the converted radiation is reflected better than the unconverted radiation 109, overall less absorption losses occur. Overall, therefore, an efficient and long-lasting stable semiconductor chip 100 or a corresponding optoelectronic component 200 can be realized.

The description with the aid of the exemplary embodiments does not limit the invention thereto. Rather, the invention comprises any new feature and any combination of features, which in particular includes any combination of features in the patent claims, even if this feature or this combination is not itself explicitly stated in the patent claims or exemplary embodiments.

The invention claimed is:

1. A light-emitting semiconductor chip, comprising:
a radiation-transmissive substrate,
an epitaxially grown semiconductor layer sequence on a main surface of the substrate,
a first contact and a second contact on a contact side of the semiconductor layer sequence facing away from the substrate for electrical and mechanical contacting of the semiconductor chip,
a transparent, electrically conductive layer which is arranged on the contact side and is electrically connected to the first contact.

2. The semiconductor chip according to claim 1, which is designed as a volume emitter, so that during operation of the semiconductor chip generated electromagnetic radiation is decoupled via a front side, a back side and side surfaces of the semiconductor chip.

3. The semiconductor chip according to claim 1, wherein the first contact and the second contact are disposed on the contact side between the transparent electrically conductive layer.

4. The semiconductor chip according to claim 1, wherein the first contact and the second contact are each arranged in a central region of the contact side.

5. The semiconductor chip according to claim 1, wherein an area ratio between 30% and 90% of the contact side is covered by the transparent, electrically conductive layer.

6. An optoelectronic component, comprising:
a semiconductor chip comprising:
a radiation-transmissive substrate,
an epitaxially grown semiconductor layer sequence on a main surface of the substrate,
a first contact and a second contact on a contact surface of the semiconductor layer sequence facing away from the substrate for electrical and mechanical contacting of the semiconductor chip,
a transparent, electrically conductive layer which is arranged on the contact side and is electrically connected to the first contact,
a carrier having a first electrical conductor and a second electrical conductor, wherein
the first contact is electrically and mechanically coupled to the first conductor and the second contact is electrically and mechanically coupled to the second conductor, and
the transparent, electrically conductive layer has a distance to the carrier along a stacking direction of the semiconductor layer sequence.

7. The component according to claim 6, wherein a converter for wavelength conversion is arranged between the transparent, electrically conductive layer and the carrier.

8. The component according to claim 7, comprising a further converter for wavelength conversion, which is arranged on a side of the substrate facing away from the contact side.

9. The component according to claim 8, wherein the converter and the further converter have mutually different concentrations of converter material.

10. The component according to claim 8, wherein the converter and the further converter comprise mutually different materials.

11. The component according to claim 7, wherein the first electrical conductor and the second electrical conductor each are configured to be reflective for converted radiation.

12. The component according to claim 7, wherein the first electrical conductor and the second electrical conductor each comprise a recessed region, in which the converter is arranged.

13. The component according to claim 6, wherein the first contact and second contact each have a projecting region coupled to the respective track to form the distance to the carrier.

14. The component according to claim 6, wherein the first electrical conductor and second electrical conductor each have a projecting region coupled to the respective contact to form the distance to the carrier.

15. The component according to claim 6, wherein the first contact and the second contact are arranged between the substrate and the two electrical conductors along the stacking direction.

* * * * *